United States Patent
Yang et al.

(10) Patent No.: US 10,205,128 B2
(45) Date of Patent: Feb. 12, 2019

(54) METHOD OF FABRICATING A LIGHT EXTRACTION LAYER, LIGHT EMITTING DIODE DISPLAY APPARATUS, AND LIGHT EMITTING DIODE DISPLAY SUBSTRATE

(71) Applicant: BOE TECHNOLOGY GROUP CO., LTD., Beijing (CN)

(72) Inventors: Jiuxia Yang, Beijing (CN); Wenyan Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/550,885

(22) PCT Filed: Feb. 28, 2017

(86) PCT No.: PCT/CN2017/075089
§ 371 (c)(1),
(2) Date: Aug. 14, 2017

(87) PCT Pub. No.: WO2017/202096
PCT Pub. Date: Nov. 30, 2017

(65) Prior Publication Data
US 2018/0241006 A1    Aug. 23, 2018

(30) Foreign Application Priority Data
May 27, 2016 (CN) .......................... 2016 1 0365849

(51) Int. Cl.
*H01J 1/62* (2006.01)
*H01L 51/52* (2006.01)
(Continued)

(52) U.S. Cl.
CPC .......... *H01L 51/5275* (2013.01); *B32B 17/00* (2013.01); *G02B 3/00* (2013.01);
(Continued)

(58) Field of Classification Search
None
See application file for complete search history.

(56) References Cited

U.S. PATENT DOCUMENTS 6,833,667 B2 * 12/2004 Hamano ............. H01L 51/5275
                                                          313/113
9,337,447 B2 *  5/2016 Krummacher ...... H01L 51/5275
(Continued)

FOREIGN PATENT DOCUMENTS

| CN | 101382606 A | 3/2009 |
| CN | 103890618 A | 6/2014 |

(Continued)

OTHER PUBLICATIONS

International Search Report & Written Opinion dated May 31, 2017, regarding PCT/CN2017/075089.
(Continued)

*Primary Examiner* — Vip Patel
(74) *Attorney, Agent, or Firm* — Intellectual Valley Law, P.C.

(57) ABSTRACT

The present application discloses a method of fabricating a light extraction layer having a corrugated surface. The method includes forming a transparent optical material layer using a transparent optical material; and forming a plurality of convex portions on a surface of the transparent optical material layer using a molding plate having a plurality of concave portions on a surface of the molding plate; the plurality of convex portions respectively substantially complementary to the plurality of concave portions.

13 Claims, 4 Drawing Sheets

(51) Int. Cl.
*H01L 51/56* (2006.01)
*G02B 3/00* (2006.01)
*B32B 17/00* (2006.01)

(52) U.S. Cl.
CPC .......... *H01L 51/52* (2013.01); *H01L 51/5203* (2013.01); *H01L 51/529* (2013.01); *H01L 51/5271* (2013.01); *H01L 51/56* (2013.01); *H01L 2251/105* (2013.01)

(56) References Cited

U.S. PATENT DOCUMENTS

| 2001/0033136 | A1 | 10/2001 | Kawase |
| 2009/0162617 | A1 | 6/2009 | Moroishi et al. |
| 2012/0091447 | A1* | 4/2012 | Yamamoto ............... F21V 5/007 257/40 |
| 2014/0293618 | A1 | 10/2014 | Koide et al. |

FOREIGN PATENT DOCUMENTS

| CN | 206076288 U | 4/2017 |
| JP | 2004031221 A | 1/2004 |
| JP | 2004127661 A | 4/2004 |
| JP | 2013029804 A | 2/2013 |

OTHER PUBLICATIONS

Chinese Search Report in the Chinese Patent Application No. 201610365849.8, dated Sep. 22, 2016; English translation attached.
First Office Action in the Chinese Patent Application No. 201610365849.8, dated Nov. 11, 2016; English translation attached.
Second Office Action in the Chinese Patent Application No. 201610365849.8, dated Jan. 19, 2017; English translation attached.
Third Office Action in the Chinese Patent Application No. 201610365849.8, dated Apr. 13, 2017; English translation attached.
Fourth Office Action in the Chinese Patent Application No. 201610365849.8, dated Jun. 20, 2017; English translation attached.
Fifth Office Action in the Chinese Patent Application No. 201610365849.8, dated Sep. 13, 2017; English translation attached.
First Office Action in the Korean Patent Application No. 20177022955, dated Jun. 28, 2018; English translation attached.

* cited by examiner

METHOD OF FABRICATING A LIGHT EXTRACTION LAYER, LIGHT EMITTING DIODE DISPLAY APPARATUS, AND LIGHT EMITTING DIODE DISPLAY SUBSTRATE

CROSS-REFERENCE TO RELATED APPLICATION

This application is a national stage application under 35 U.S.C. § 371 of International Application No. PCT/CN2017/075089 filed Feb. 28, 2017, which claims priority to Chinese Patent Application No. 201610365849.8, flied May 27, 2016, the contents of which are incorporated by reference in the entirety.

TECHNICAL FIELD

The present invention relates to display technology, more particularly, to a novel light extraction layer and a method of fabricating a light extraction layer.

BACKGROUND

As compared to other display devices such as liquid crystal display (LCD) devices, the organic light emitting diode (OLED) display devices are self-emitting apparatuses that do not require a backlight. Having the advantages of fast response, a wider viewing angle, high brightness, more vivid color rendering, thinner and lighter, they have found a wide range of applications in display field. Typically, OLED display apparatuses may be categorized into three types, a top-emission type OLED, a bottom-emission type OLED, and a dual-emission type OLED.

SUMMARY

In one aspect, the present invention provides a method of fabricating a light extraction layer having a corrugated surface, comprising forming a transparent optical material layer using a transparent optical material; and forming a plurality of convex portions on a surface of the transparent optical material layer using a molding plate comprising a plurality of concave portions on a surface of the molding plate; the plurality of convex portions respectively substantially complementary to the plurality of concave portions.

Optionally, forming the plurality of convex portions comprises deforming the transparent optical material layer by pressing the molding plate and the transparent optical material layer against each other thereby forming a plurality of first convex portions on the surface of the transparent optical material layer.

Optionally, prior to deforming, the transparent optical material layer, further comprising heating the transparent optical material layer to reduce solvent content.

Optionally, subsequent to deforming the transparent optical material layer, the method further comprises modifying a surface of the plurality of first convex portions by curing the transparent optical material layer; wherein the transparent optical material is a curable material.

Optionally, subsequent to modifying the surface of the plurality of first convex portions, the method further comprises re-pressing the molding plate and the transparent optical material layer against each other at least one time.

Optionally, the method further comprises re-curing the transparent optical material layer after each time re-pressing the molding plate and the transparent optical material layer, against each other is repeated.

Optionally, prior to deforming the transparent optical material layer, the method further comprises heating the transparent optical material layer to reduce solvent content; and subsequent to deforming the transparent optical material layer, the method further comprises modifying a surface of the plurality of first convex portions by curing the transparent optical material layer; subsequent to modifying the surface of the plurality of first convex portions, re-pressing the molding plate and the transparent optical material layer against each other; and reiterating modifying and pressing steps at least once.

Optionally, the method further comprises baking the transparent optical material layer thereby forming the light extraction layer having the corrugated surface and comprising the plurality of convex portions.

Optionally, the plurality of concave portions are formed to have a substantially radiused surface.

Optionally, pressing the molding plate and the transparent optical material layer against each other is performed under a pressure in a range of approximately 1.5 atmospheric pressure to approximately 2.5 atmospheric pressure for a duration in a range of approximately 15 seconds to approximately 3 minutes.

Optionally, heating the transparent optical material layer is performed at a temperature in a range of approximately 10 degrees to approximately 135 degrees for a duration in a range of approximately 50 seconds to approximately 10 minutes.

Optionally, curing the transparent optical material layer is performed at a temperature in a range of approximately 30 degrees to approximately 140 degrees for a duration in a range of approximately 1 minute to approximately 10 minutes.

Optionally, re-pressing the molding plate and the transparent optical material layer against each other at least one time is performed under a pressure in a range of approximately 1.0 atmospheric pressure to approximately 1.5 atmospheric pressure for a duration in a range of approximately 50 seconds to approximately 20 minutes.

Optionally, re-ailing the transparent optical material layer is performed at a temperature in a range of approximately 30 degrees to approximately 140 degrees for a duration in a range of approximately 1 minute to approximately 10 minutes.

Optionally, baking the transparent optical material layer is performed at a temperature in a range of approximately 70 degrees to approximately 190 degrees for, a duration in a range of approximately 1 minute to approximately 30 minutes.

Optionally, forming the transparent optical material layer comprises mixing the transparent optical material with an additive to form a mixture; and forming the transparent optical material layer using the mixture; wherein the additive promotes formation of a uniform thickness of the transparent optical material layer.

In another aspect, the present invention provides a light emitting diode display apparatus having the light extraction layer fabricated by the method described herein.

In another aspect, the present invention provides a light emitting diode display apparatus, comprising a light extraction layer having a corrugated surface; wherein the light extraction layer comprises a plurality of convex portions having a substantially radiused surface.

Optionally, the light extraction layer has a refraction index of no less than 1.5.

In another aspect, the present invention provides a light emitting diode base substrate, comprising a light extraction layer having a corrugated surface; wherein the light extraction layer comprises a plurality of convex portions having a substantially radiused surface.

Optionally, the light extraction layer has a refraction index of no less than 1.5.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is no intended to be exhaustive or to be limited to the precise form disclosed.

Conventional display apparatuses, e.g., conventional organic light emitting diode apparatuses, have a low light extraction efficiency. A large fraction of light emitted from the light emitting layer is lost at interfaces between various layers of the display apparatus due to the total internal reflection at the interfaces.

Accordingly, the present invention provides, inter alto, a novel, light extraction layer and a method of fabricating a light extraction layer that substantially obviate one or more of the problems due to limitations and disadvantages of the related art. In one aspect, the present disclosure provides a light emitting diode display apparatus including alight extraction layer having a corrugated surface for refracting light. Optionally, the light extraction layer includes a plurality of convex portions having a substantially radiused surface. Optionally, the polymer material has a refraction index of no less than 1.5. Optionally, the light extraction layer is made of an optical material. Optionally, the light extraction layer is made of a polymer material.

As user herein, the term "optical material" refers to a material which is substantially transparent for optical radiation at an operating wavelength of the light extraction layer of the present disclosure (or a display panel having the light extraction layer).

As user herein, the term "radiused" in the context of the present disclosure refers to a surface of the convex portion or a surface of the light extraction layer has been smoothed to a substantially rounded shape. For example, any corner on the surface is to have a gentle, gradual transition from a first direction to a second direction. The substantially rounded shape may be, for example, a substantially circular form (e.g., a half circle, a quarter circle), a substantially arc form, a substantially parabolic form, or any combination thereof, as long as any sharp edge is to be avoided. Optionally, a radiused surface is substantially free of micro-tips and micro-protrusions. Optionally, a radiused surface is substantially free of micro-fissures and micro-stress.

Figure 1:
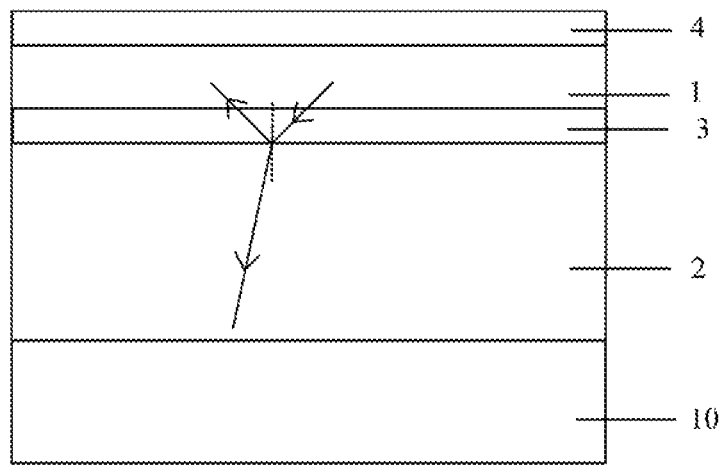
FIG. 1 is a schematic diagram illustrating the structure of a bottom-emission type light emitting diode display apparatus in some embodiments according to the present disclosure.
Figure 2:
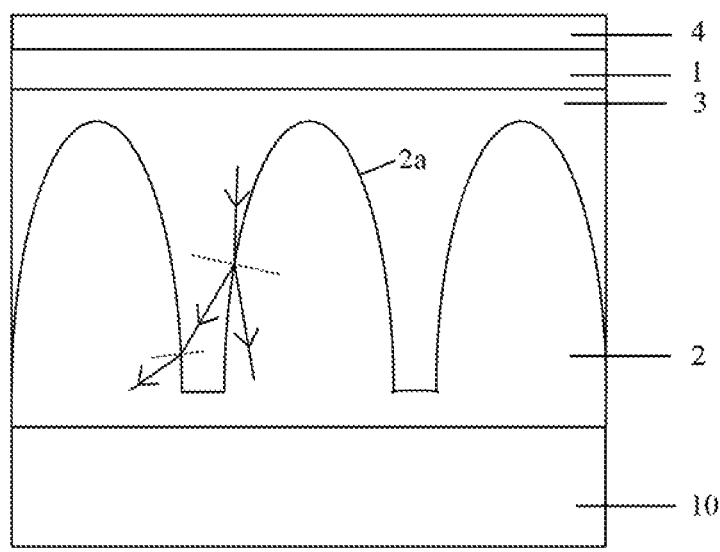
FIG. 2 is a schematic diagram illustrating, the structure of a bottom-emission type light emitting diode display apparatus in some embodiments according to the present disclosure.

FIGS. 1-2 are schematic diagrams illustrating the structures of bottom-emission type light emitting diode display apparatuses in some embodiments according to the present disclosure. Referring to FIG. 1, the light emitting diode display apparatuses in FIG. 1 includes a base substrate 10, a light extraction layer 2 on the base substrate 10, a first electrode 3 on a side of the light extraction layer 2 distal to the base substrate 10, a light emitting layer 1 on a side of the first electrode 3 distal to the light extraction layer 2, and a second electrode 4 on a side of the light emitting layer 1 distal to the first electrode 3. The light extraction layer 2 in FIG. 1 has a substantially flat surface, e.g., the light extraction layer 2 has a substantially uniform thickness throughout the entire layer. As illustrated in FIG. 1, light transmitted from the light emitting layer 1 travels to the interface between the first electrode 3 and the light extraction layer 2, is refracted into the light extraction layer 2, and emits out of the light emitting diode display apparatus through a light emitting side (e.g., through the base substrate 10). However, a large portion of the light transmitted from the light emitting layer 1 cannot exit from the light emitting side (e.g., through the base substrate 10) due to the total internal reflection at the interface between the light extraction layer 2 and the first electrode 3. As shown in FIG. 1, a large portion of light is reflected back into the light emitting diode display apparatus along a direction opposite to the light emitting side of the light emitting diode display apparatus. Referring to FIG. 2, the light emitting diode display apparatuses FIG. 2 includes a base substrate 10, a light extraction layer 2 on the base substrate 10, a first electrode 3 on a side of the light extraction layer 2 distal to the base substrate 10, a light emitting layer 1 on a side of the first electrode 3 distal to the light extraction layer 2, and a second electrode 4 on a side of the light emitting layer 1 distal to the first electrode 3. The light extraction layer 2 in FIG. 2, however, has a corrugated surface includes a plurality of convex portions 2a. Optionally, each of the plurality of convex portions 2a has a substantially radiused surface. As shown in FIG. 2, light transmitted from the light emitting layer 1 travels to the interface between the first electrode 3 and the light extraction layer 2, is refracted into the light extraction layer 2, and emits out of the light emitting diode display apparatus through a light emitting side (e.g., through the base substrate 10). Due to the presence of the plurality of convex portions 2a, a majority of light transmitted from the light emitting layer 1 is not reflected back into the light emitting layer but refracted into the light extraction layer 2. Thus, light loss due to the total internal reflection at the interface between layers of the light emitting diode display apparatus is substantially eliminated.

Figure 3:
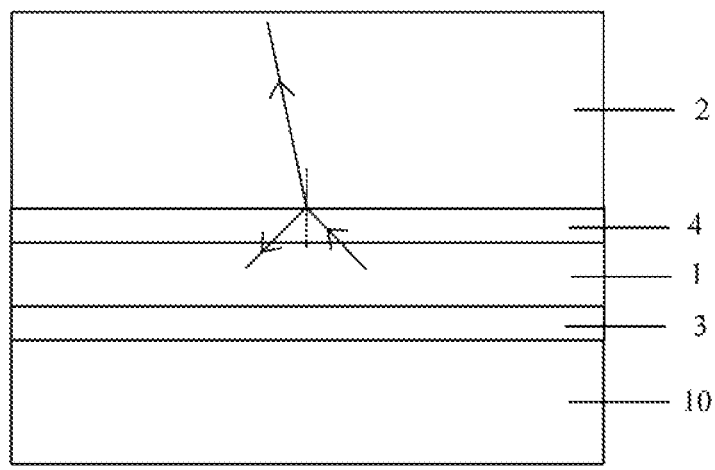
FIG. 3 is a schematic diagram illustrating the structure of a top-emission type light emitting diode display apparatus in some embodiments according to the present disclosure.
Figure 4:
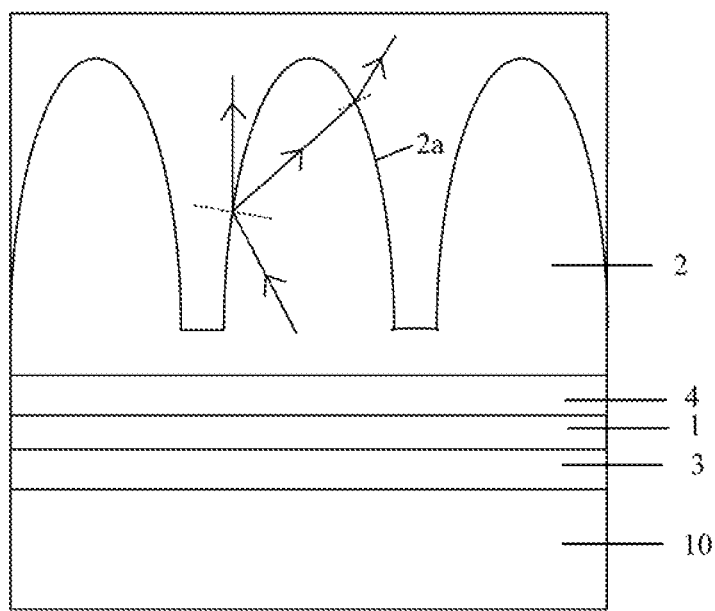
FIG. 4 is a schematic diagram illustrating the structure of a top-emission type light emitting diode display apparatus in some embodiments according to the present disclosure.

Similarly, FIGS. 3-4 are schematic diagrams illustrating the structures of top-emission type light emitting diode display apparatuses in some embodiments according to the present disclosure. Referring to FIG. 3, the light emitting diode display apparatuses in FIG. 3 includes a base substrate 10, a first electrode 3 on the base substrate 10, a light emitting layer 1 on a side of the first electrode 3 distal to the base substrate 10, a second electrode on a side of the light emitting layer 1 distal to the first electrode 3, and a light extraction layer 2 on a side of the second electrode 4 distal to the light emitting layer 1. The light extraction layer 2 in FIG. 3 has a substantially flat surface, e.g., the light extraction layer 2 has a substantially uniform thickness throughout the entire layer. As illustrated in FIG. 3, light transmitted from the light emitting layer 1 travels to the interface between the second electrode 4 and the light extraction layer 2, and emits out of the light emitting diode display apparatus through a light emitting side (e.g., through the light extraction layer 2). However, a large portion of the light transmitted from the light emitting layer 1 cannot exit from the light emitting side (e.g., through the light extraction layer 2) due to the total internal reflection at the interface between the light extraction layer 2 and the second electrode 4. As shown in FIG. 3, a large portion of light is reflected back into the light emitting diode display apparatus along a direction opposite to the light emitting side of the light emitting diode display apparatus. Referring to FIG. 4, the light emitting diode display apparatus in FIG. 4 includes a base substrate 10, a first electrode 3 on the base substrate 10, a light emitting layer 1 on a side of the first electrode 3 distal to the base substrate 10, a second electrode on a side of the light emitting layer 1 distal to the first electrode 3, and a light extraction layer 2 on a side of the second electrode 4 distal to the light emitting layer 1. The light extraction layer 2 in FIG. 4, however, has a corrugated surface includes a plurality of convex portions 2a. Optionally, each of the plurality of convex portions 2a has a substantially radiused surface. As shown in FIG. 4, light transmitted from the light emitting layer 1 travels to the interface between the second electrode 4 and the light extraction layer 2, is refracted into the light extraction layer 2, and emits out of the light emitting diode display apparatus through a light emitting side (e.g., through the light extraction layer 2). Due to the presence of the plurality of convex portions 2a, a majority of light transmitted from the light emitting layer 1 is not reflected back into the light emitting layer 1, but refracted into the light extraction layer 2. Thus, tight loss due to the total internal reflection at the interface between layers of the light emitting diode display apparatus is substantially eliminated.

Figure 5:
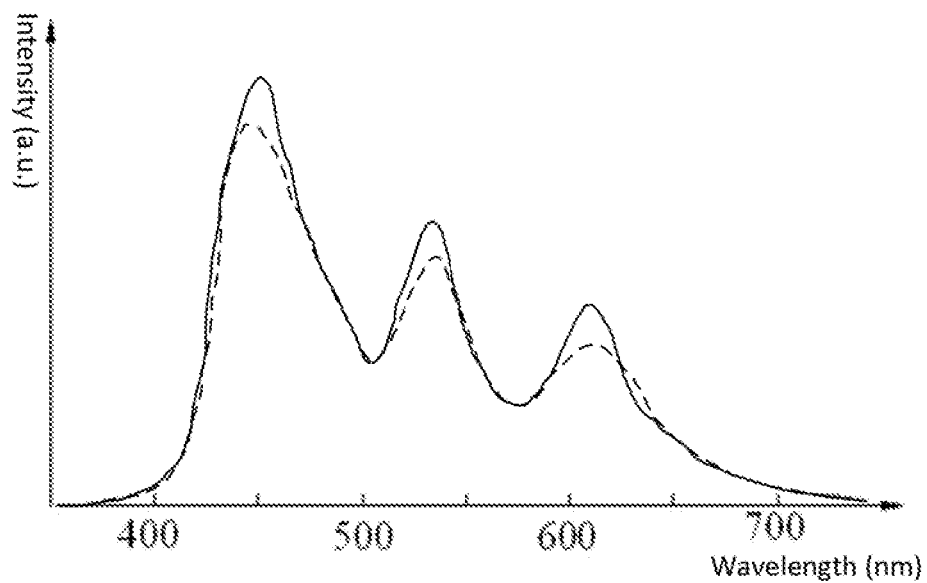
FIG. 5 shows a comparison between light extraction efficiencies of a light emitting diode display apparatus having a light extraction layer in some embodiments according to the present disclosure and a conventional light emitting diode display apparatus without a light extraction layer.

Thus, inclusion of a light extraction layer having a corrugated surface and a plurality of convex portions significantly increases light extraction efficiency and external quantum efficiency of the present light emitting diode display apparatus. FIG. 5 shows a comparison between light extraction efficiencies of a light emitting diode display apparatus having a light extraction layer in some embodiments according to the present disclosure and a conventional light emitting diode display apparatus without a light extraction layer. Referring to FIG. 5, the solid line represents the light intensity of light emitted from a light emitting diode display apparatus having a light extraction layer having a corrugated surface, and the dotted line represents the light intensity of light emitting from a conventional light emitting diode display apparatus without a light extraction layer. As shown in FIG. 5, the light extraction efficiency in the present light emitting diode display apparatus is significantly higher than that in the conventional light emitting diode display apparatus. The external quantum efficiency in the present light emitting diode display apparatus is enhanced by nearly 20% as compared to the conventional light emitting diode display apparatus.

In another aspect, the present disclosure provides a method of fabricating a light extraction layer. In some embodiments, the method includes forming a light extraction layer having a corrugated surface, the light extraction layer is formed to include a plurality of convex portions respectively substantially complementary to the plurality of concave portions. Optionally, forming the light extraction layer includes forming the light extraction layer having a corrugated surface using a molding plate. By including the present light extraction layer having a corrugated surface in a light emitting diode display apparatus, light loss due to the total internal reflection at interfaces between various layers of the light emitting diode display apparatus can be reduced or eliminated. Accordingly, a light emitting diode display apparatus having the light extraction layer fabricated by the present method has an increased display brightness, a lower power consumption, and a larger viewing angle.

In some embodiments, the step of forming the light extraction layer having the corrugated surface includes forming a plurality of convex portions on a surface of the light extraction layer. Optionally, the molding plate includes a plurality of concave portions on a surface of the molding plate. Optionally, the plurality convex portions of the light extraction layer are respectively substantially complementary to the plurality of concave portions on the surface of the molding plate. By using a molding plate for fabricating the light extraction layer, the manufacturing costs can be reduced as the present fabrication process uses one less mask plate for patterning the light emitting diode display apparatus.

In some embodiments, the step of forming the light extraction layer having the corrugated surface includes disposing a transparent optical material directly on the surface of the molding plate. The transparent optical material fills in the plurality of concave portions on the surface of the molding plate, thereby forming the light extraction layer having a plurality of convex portions. The step further includes separating the molding plate from the light extraction layer.

In some embodiments, the corrugated surface is an exposed surface of the light extraction layer after the step of forming the light extraction layer. For example, in some embodiments, the step of forming the light extraction layer includes forming a transparent optical material layer using a transparent optical material; and subsequent to forming the transparent optical material layer, forming the plurality of convex portions on a surface of the transparent optical material layer thereby forming the corrugated surface.

Optionally, the light extraction layer is formed to have a single layer structure. Optionally, the light extraction layer is formed to be a laminated light extraction layer having two or more sub-layers laminated together.

The transparent optical material for making the light extraction layer may be a material having a relatively high refraction index. Optionally, the transparent optical material has a refraction index of no less than 1.5.

Optionally, the transparent optical material includes a polymer material. Optionally, the transparent optical material includes a resin. Optionally, transparent optical material includes a curable material so that the transparent optical material layer is curable.

In some embodiments, the step of forming the plurality of convex portions includes deforming the transparent optical material layer by pressing the molding plate and the transparent optical material layer against each other thereby forming a plurality of first convex portions. The purpose of the deforming step is to form the plurality of first convex portions and the corrugated surface on the transparent optical material layer. Optionally, the step of pressing the molding plate and the transparent optical material layer against each other is performed under a pressure in a range of approximately 1.5 atmospheric pressure to approximately 2.5 atmospheric pressure for a duration in a range of approximately 15 seconds to approximately 3 minutes. Optionally, the step of pressing the molding plate and the transparent optical material layer against each other is performed under a pressure of approximately 2 atmospheric pressure for a duration in a range of approximately 0.5 minute to approximately 3 minutes. Optionally, the step of pressing the molding plate and the transparent optical material layer against each other is performed under a pressure of approximately 1.8 atmospheric pressure for a duration in a range of approximately 15 seconds to approximately 150 seconds. Optionally, the step of pressing the molding plate and the transparent optical material layer against each other is performed under a pressure in a range of approximately 1.5 atmospheric pressure to approximately 2.3 atmospheric pressure for a duration in a range of approximately 20 seconds to approximately 1 minute. In one example, the step of pressing the molding plate and the transparent optical material layer against each other is performed under a pressure of approximately 2 atmospheric pressure for a duration of approximately 50 seconds. In another example, the step of pressing the molding plate and the transparent optical material layer against each other is performed under a pressure of approximately 1.8 atmospheric pressure for a duration of approximately 35 seconds.

In some embodiments, prior to deforming the transparent optical material lay the method further includes heating the transparent optical material layer to reduce solvent content. The purpose of the heating step is to reduce solvent content of the transparent optical material layer, thereby facilitating the subsequent deforming step using the molding plate. Optionally, the step of heating the transparent optical material layer is performed at a temperature in a range of approximately 10 degrees to approximately 135 degrees for a duration in a range of approximately 50 seconds to approximately 10 minutes. Optionally, the step of heating the transparent optical material layer is performed at a temperature in a range of approximately 10 degrees to approximately 110 degrees for a duration in a range of approximately 2 minutes to approximately 10 minutes. Optionally, the step of heating the transparent optical material layer is performed at a temperature in a range of approximately 35 degrees to approximately 135 degrees for a duration in a range of approximately 50 seconds to approximately 5 minutes. Optionally, the step of heating the transparent optical material layer is performed at a temperature in a range of approximately 55 degrees to approximately 85 degrees for a duration in a range of approximately 2 minutes to approximately 6 minutes. Optionally, the step of heating the transparent optical material layer is performed at a temperature in a range of approximately 60 degrees to approximately 80 degrees for a duration in a range of approximately 3 minutes to approximately 5 minutes. In one example, the step of heating the transparent optical material layer is performed at a temperature of approximately 60 degrees for a duration of approximately 5 minutes. In another example, the step of heating the transparent optical material layer is performed at a temperature of approximately 85 degrees for a duration of approximately 3 minutes. In general, the longer the heating duration, the lower the heating temperature is required to sufficiently reduce solvent content of the transparent optical material layer. Optionally, the transparent optical material is a curable resin material.

In some embodiments, the transparent optical material is a curable material, and the method further includes, subsequent to deforming the transparent optical material layer, modifying a surface of the plurality of first convex portions by curing the transparent optical material layer. The purpose of the curing step is to reduce or eliminate micro-stress, micro-protrusions, micro-tips, and micro-fissures generated during the deforming step, rendering the surface of the plurality of first convex portions substantially radiused. Optionally, the step of curing the transparent optical material layer is performed at a temperature in a range of approximately 30 degrees to approximately 140 degrees for a duration in a range of approximately 1 minute to approximately 10 minutes. Optionally, the step of curing the transparent optical material layer is performed at a temperature in a range of approximately 30 degrees to approximately 140 degrees for a duration in a range of approximately 1 minute to approximately 5 minutes. Optionally, the step of curing the transparent optical material layer is performed at a temperature in a range of approximately 35 degrees to approximately 135 degrees for a duration in a range of approximately 2 minute to approximately 10 minutes. Optionally, the step of curing the transparent optical material layer is performed at a temperature in a range of approximately 80 degrees to approximately 95 degrees for a duration in a range of approximately 1 minute to approximately 10 minutes. Optionally, the step of curing the transparent optical material layer is performed at a temperature in a range of approximately 85 degrees to approximately 90 degrees for a duration in a range of approximately 1.5 minute to approximately 8 minutes. In one example, the step of curing the transparent optical material layer is performed at a temperature of approximately 90 degrees for a duration of approximately 1.5 minutes. In another example, the step of curing the transparent optical material layer is performed at a temperature of approximately 85 degrees for a duration of approximately 8 minutes.

In some embodiments, the method further includes, subsequent to the step of modifying the surface of the plurality of first convex portions, re-pressing the molding plate and the transparent optical material layer against each other at least one time. The purpose of the re-pressing step is to re-shape the plurality of first convex portions to conform to the shape defined by the molding plate. Optionally, the step of re-pressing the molding plate and the transparent optical material layer against each other at least one time is performed under a pressure in a range of approximately 1.0 atmospheric pressure to approximately 1.5 atmospheric pressure for a duration in a range of approximately 50 seconds to approximately 20 minutes. Optionally, the step of re-pressing the molding plate and the transparent optical material layer against each other at least one time is performed under a pressure of approximately 1.0 atmospheric pressure for a duration in a range of approximately 50 seconds to approximately 5 minutes. Optionally, the step of re-pressing the molding plate and the transparent optical material layer against each other at least one time is performed under a pressure of approximately 1.0 atmospheric pressure for a duration in a range of approximately 10 minutes to approximately 20 minutes. In one example, the step of re-pressing the molding plate and the transparent optical material layer against each other at least one time is performed under a pressure of approximately 1.0 atmospheric pressure for a duration of approximately 2 minutes. In another example, the step of re-pressing the molding plate and the transparent optical material layer against each other at least one time is performed under a pressure of approximately 1.0 atmospheric pressure for a duration of approximately 3 minutes.

In some embodiments, the method further includes re-curing the transparent optical material layer after each time re-pressing the molding plate and the transparent optical material layer against each other is repeated. The purpose of the re-curing step is to reduce or eliminate micro-stress, micro-protrusions, micro-tips, and micro-fissures generated during the re-pressing step, rendering the surface of the plurality of convex portions substantially radiused. Optionally, the step of re-curing the transparent optical material layer is performed at a temperature in a range of approximately 30 degrees to approximately 140 degrees for a duration in a range of approximately 1 minute to approximately 10 minutes. Optionally, the step of re-curing the transparent optical material layer is performed at a temperature in a range of approximately 30 degrees to approximately 140 degrees for a duration in a range of approximately 1 minute to approximately 5 minutes. Optionally, the step of re-curing the transparent optical material layer is performed at a temperature in a range of approximately 35 degrees to approximately 135 degrees for a duration in a range of approximately 2 minute to approximately 10 minutes. Optionally, the step of re-curing the transparent optical material layer is performed at a temperature in a range of approximately 80 degrees to approximately 95 degrees for a duration in a range of approximately 1 minute to approximately 10 minutes. Optionally, the step of re-curing the transparent optical material layer is performed at a temperature in a range of approximately 85 degrees to approximately 90 degrees for a duration in a range of approximately 1.5 minute to approximately 8 minutes. In one example, the step of re-curing the transparent optical material layer is performed at a temperature of approximately 90 degrees for a duration of approximately 1.5 minutes. In another example, the step of re-curing the transparent optical material layer is performed at a temperature of approximately 85 degrees for a duration of approximately 8 minutes.

In some embodiments, the method includes heating the transparent optical material layer to reduce solvent content; deforming the transparent optical material layer by pressing the molding plate and the transparent optical material layer against each other thereby forming a plurality of first convex portions; modifying a surface of the plurality of first convex portions by curing the transparent optical material layer; subsequent to modifying the surface of the plurality of first convex portions, re-pressing the molding plate and the transparent optical material layer against each other; and reiterating modifying and pressing steps at least once. Optionally, the step of heating the transparent optical material layer is performed at a temperature in a range of approximately 10 degrees to approximately 110 degrees for a duration in a range of approximately 2 minutes to approximately 10 minutes; the step of pressing the molding plate and the transparent optical material layer against each other is performed under a pressure of approximately 2 atmospheric pressure for a duration in a range of approximately 0.5 minute to approximately 3 minutes; the step of curing the transparent optical material layer is performed at a temperature in a range of approximately 30 degrees to approximately 140 degrees for a duration in a range of approximately 1 minute to approximately 5 minutes; and the step of re-pressing the molding plate and the transparent optical material layer against each other at least one time is performed under a pressure of approximately 1.0 atmospheric pressure for a duration in a range of approximately 50 seconds to approximately 5 minutes. Optionally, the step of heating the transparent optical material layer is performed at a to in a range of approximately 35 degrees to approximately 135 degrees for a duration in a range of approximately 50 seconds to approximately 5 minutes; the step of pressing the molding plate and the transparent optical material layer against each other is performed under a pressure of approximately 1.8 atmospheric pressure for a duration in a range of approximately 15 seconds to approximately 150 seconds; the step of curing the transparent optical material layer is performed at a temperature in a range of approximately 35 degrees to approximately 135 degrees for a duration in a range of approximately 2 minute to approximately 10 minutes; and the step of re-pressing the molding plate and the transparent optical material layer against each other at least one time is performed under a pressure of approximately 1.0 atmospheric pressure for a duration in a range of approximately 10 minutes to approximately 20 minutes.

In some embodiments, subsequent to the deforming and modifying steps, the method further includes baking the transparent optical material layer thereby forming the light extraction layer having the corrugated surface and including the plurality of convex portions. The purpose of the baking step is to reduce or eliminate micro-stress, micro-protrusions, micro-tips, and micro-fissures generated during the re pressing step, rendering the surface of the plurality of convex portions substantially radiused. The light extraction layer fabricated by the present method is substantially free of any micro-tips and micro-protrusions, obviating point discharging detects in the final light emitting diode display apparatus. Optionally, the step of baking the transparent optical material layer is performed at a temperature an a range of approximately 70 degrees to approximately 190 degrees for a duration in a range of approximately 1 minute to approximately 30 minutes. Optionally, the step of baking the transparent optical material layer is performed at a temperature in a range of approximately 80 degrees to approximately 140 degrees for a duration in a range of approximately 1 minute to approximately 20 minutes. In one example, the step of baking the transparent optical material layer is performed at a temperature of approximately 120 degrees for a duration of approximately 3 minute. In another example, the step of baking the transparent optical material layer is performed at a temperature of approximately 120 degrees for a duration of approximately 18 minute.

In some embodiments, the step of forming the transparent optical material layer includes mixing the transparent optical material with an additive to form a mixture; and forming the transparent optical material layer using the mixture. Optionally, the additive is a compound that promotes formation of a uniform thickness of the transparent optical material layer. By including the additive in the mixture for making the transparent optical material layer, the mixture material has an enhanced self-leveling property, can evenly distribute over a surface to form a transparent optical material layer having a substantially uniform thickness throughout the entire layer. Moreover, the self-leveling property of the mixture material prevents formation of micro-tips and micro-protrusions on the surface of the transparent optical material layer. For example, every time the transparent optical material layer having the plurality of first convex portions is subject to a curing step or a baking step, the self-leveling property of the mixture material prevents formation of micro-tips, micro-protrusions, micro-stress, and micro-fissures on the surface of the transparent optical material layer or on the surface of the light extraction layer, enhancing the properties of the final light emitting diode display apparatus.

Optionally, the molding plate is made of an elastic material. Optionally, the molding plate is made of an elastic material selected from a group consisting of poly-silicone, epoxy resin, polyurethane, polyimide, and phenolic resin. Optionally, the molding plate is made of polydimethylsiloxane. By using a molding plate made of an elastic material, formation of micro-tips and micro protrusions on the surface of the transparent optical material layer can be further prevented.

Optionally, the transparent optical material is a curable material. Optionally, the transparent optical material is a curable polymer material. Optionally, the transparent optical material is a heat-curable material. Optionally, the transparent optical material is a heat-curable polymer material. Optionally, the transparent optical material is a light curable material (e.g., a UV light curable material). Optionally, the transparent optical material is a light curable polymer material (e.g., a UV light curable polymer material).

In one example, the transparent optical material is a heat-curable material. The method of forming the light extraction layer includes forming a transparent optical material layer using a transparent optical material; heating the transparent optical material layer to reduce solvent content at a temperature in a range of approximately 10 degrees to, approximately 110 degrees for a duration in a range of approximately 2 minutes to approximately 10 minutes; deforming the transparent optical material layer by pressing a molding plate and the transparent optical material layer against each other under a pressure of approximately 2 atmospheric pressure for a duration in a range of approximately 0.5 minute to approximately 3 minutes, the molding plate including a plurality of concave portions on a surface of the molding plate, the surface having the plurality of concave portions is pressed against the transparent optical material layer thereby forming a plurality of first convex portions on a surface of the transparent optical material layer; modifying a surface of the plurality of first convex portions by curing the transparent optical material layer at a temperature in a range of approximately 30 degrees to approximately 140 degrees for a duration in a range of approximately 1 minute to approximately 5 minutes; re-pressing the molding plate and the transparent optical material layer against each other under a pressure of approximately 1.0 atmospheric pressure for a duration in a range of approximately 50 seconds to approximately 5 minutes; and baking the transparent optical material layer thereby forming, the light extraction layer having the corrugated surface and the plurality of convex portions. The process includes a heating step to reduce solvent content, a curing step to modify the surface of the plurality of first convex portions, a pressing step after the heating step, and a re-pressing step after the curing step. The pressing step and the re-pressing step deform the transparent optical material layer to form the plurality of convex portions on its surface. The curing step and the baking step reduce or eliminate micro-stress, micro-protrusions, micro-tips, and micro-fissures generated during the pressing step or the re-pressing step.

In another example, the transparent optical material is a light-curable material. The method of forming the light extraction layer includes forming a transparent optical material layer using a transparent optical material; heating the transparent optical material layer to reduce solvent content at a temperature in a range of approximately 35 degrees to approximately 135 degrees for a duration in a range of approximately 50 seconds to approximately 5 minutes; deforming the transparent optical material layer by pressing a molding plate and the transparent optical material layer against each other under a pressure of approximately 1.8 atmospheric pressure for a duration in a range of approximately 15 seconds to approximately 150 seconds, the molding plate including a plurality of concave portions on a surface of the molding plate, the surface having the plurality of concave portions is pressed against the transparent optical material layer thereby forming a plurality of first convex portions on a surface of the transparent optical material layer; modifying a surface of the plurality of first convex portions by curing the transparent optical material layer at a temperature in a range of approximately 35 degrees to approximately 135 degrees for a duration in a range of approximately 2 minute to approximately 10 minutes; re-pressing the molding plate and the transparent optical material layer against each other under a pressure of approximately 1.0 atmospheric pressure far a duration in a range of approximately 10 minutes to approximately 20 minutes; and baking the transparent optical material layer thereby forming the light extraction layer having the corrugated surface and the plurality of convex portions. The process includes a heating step to reduce solvent content, a curing step to modify the surface of the plurality of first convex portions, a pressing step after the heating step, and a re-pressing step after the curing step. The pressing step and the re-pressing step deform the transparent optical material layer to form the plurality of convex portions on its surface. The curing step and the baking step reduce or eliminate micro-stress, micro-protrusions, micro-tips, and micro-fissures generated during the pressing step or the re-pressing step. Optionally, the transparent optical material is a UN light-curable material, and the curing step includes curing the transparent optical material layer using a UV light.

In some embodiments, the plurality of first convex portions on the surface of the transparent optical material layer may be formed by other appropriate methods. For example, the plurality of first convex portions may be formed in a lithography process. Optionally, subsequent to forming the plurality of first convex portions, the method further includes one or more of the curing step, the re-curing step, the re-pressing step, and the baking step described herein.

In one example, the method includes forming a transparent optical material layer using a transparent optical material; patterning the transparent optical material layer to form a plurality of convex portions on a surface of the transparent optical material layer; and modifying a surface of the plurality of first convex portions by curing the transparent optical material layer. Optionally, the method further includes, subsequent to the step of modifying the surface of the plurality of first convex portions, pressing the molding plate and the transparent optical material layer against each other. Optionally, subsequent to the pressing step, the method further includes re-curing the transparent optical material layer at least one time; and re-pressing the molding plate and the transparent optical material layer against each other at least one time. Optionally, the method further includes baking the transparent optical material layer thereby forming the light extraction layer having the corrugated surface and the plurality of convex portions.

In another aspect, the present disclosure provides a method of fabricating a display substrate. In some embodiments, the method of fabricating the display substrate includes fabricating a light extraction layer as described herein.

In another aspect, the present disclosure provides a method of fabricating a display apparatus. In some embodiments, the method of fabricating the display apparatus includes fabricating a light extraction layer as described herein. Optionally, the display apparatus is a liquid crystal display apparatus. Optionally, the display apparatus is a light emitting diode display apparatus.

In another aspect, the present disclosure provides a method of fabricating a light emitting diode display apparatus. In some embodiments, the method of fabricating the light emitting diode display apparatus includes fabricating a light extraction layer as described herein.

The light extraction layer fabricated by the present method may be used for various purposes. In one example, the light extraction layer may be used for enhancing light utilization efficiency of a back light in a liquid crystal display apparatus. For example, the light extraction layer may be disposed in a light path of a back light in a liquid crystal display apparatus. The light extraction layer is configured to reduce light loss of light transmitted from the back light due to the total internal reflection at an interface between the back light and other layers of the liquid crystal display apparatus.

In another example, the light extraction layer is used in a light emitting diode display apparatus, e.g., a light emitting diode display apparatus. Optionally, the light emitting diode display apparatus is an organic light emitting diode display apparatus. Optionally, the light emitting diode display apparatus is a quantum dots light emitting diode display apparatus.

In another aspect, the present disclosure provides a light extraction layer fabricated by the present method. In another aspect, the present disclosure provides a display substrate having a light extraction layer fabricated by the present method. In another aspect, the present disclosure provides a display panel having a light extraction layer fabricated by the present method. In another aspect, the present disclosure provides a display apparatus having a light extraction layer fabricated by the present method.

In another aspect, the present disclosure provides a light extraction layer having a corrugated surface and including a plurality of convex portions forming, the corrugated surface. Optionally, the plurality of convex portions have a substantially radiused surface. Optionally, each of the plurality of convex portions has a substantially radiused surface. Optionally, the light extraction layer is made of an optical polymer material, e.g., a resin. Optionally, the light extraction layer is made of a material having a refraction index of no less than 1.5. Optionally, the corrugated surface includes a plurality of convex portions spaced apart by a plurality of concave portions. Optionally, each of the plurality of convex portions has a diameter or width in a range of approximately 1 μm to approximately 500 μm, e.g., approximately 1 μm to approximately 10 μm, approximately 10 μm to approximately 100 μm, approximately 100 μm to approximately 250 μm, and approximately 250 μm to approximately 500 μm. Optionally, the light extraction layer is substantially free of micro-tips and micro-protrusions. Optionally, the light extraction layer is substantially free of micro-stress and micro-fissures.

Optionally, the light extraction layer has a single layer structure. Optionally, the light extraction layer includes two or more sub-layers laminated together. Optionally, refraction indexes of the two or more sub-layers increase along a light emitting direction, e.g., a direction from the light emitting layer to a light emitting side of a display panel.

The transparent optical material for making the light extraction layer may be a material having a relatively high refraction index. Optionally, the transparent optical material has a refraction index of no less than 1.5.

In another aspect, the present disclosure provides a base substrate for a display substrate. In some embodiments, the base substrate includes a support substrate and a light extraction layer on the support substrate for enhancing light extraction efficiency of the display substrate. The light extraction layer has a corrugated surface on a side of the light extraction layer distal to the support substrate. Optionally, the plurality of convex portions have a substantially radiused surface. Optionally, each of the plurality of convex portions has a substantially radiused surface. Optionally, the light extraction layer is made of an optical polymer material, e.g., a resin. Optionally, the light extraction layer is made of a material having a refraction index of no less than 1.5. Optionally, the corrugated surface includes a plurality of convex portions spaced apart by a plurality of concave portions.

In another aspect, the present disclosure provides a display substrate having, a light extraction layer described herein or fabricated by a method described herein. In another aspect, the present disclosure provides a display panel having a light extraction layer described herein or fabricated by a method described herein. In another aspect, the present disclosure provides a display apparatus having a light extraction layer described herein or fabricated by a method described herein. Examples of appropriate display apparatus include, but are not limited to, an electronic paper, a mobile phone, a tablet computer, a television, a monitor, a notebook computer, a digital album, a GPS, etc. Optionally, the display apparatus is a light emitting diode display apparatus. Optionally, the light emitting diode display apparatus is an organic light emitting diode display apparatus. Optionally, the tight emitting diode display apparatus is a quantum dots light emitting diode display apparatus.

Figure 6:
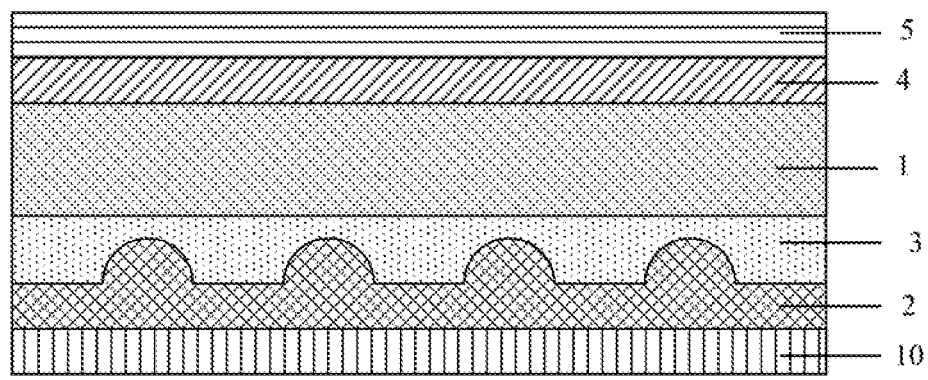
FIG. 6 is a schematic diagram illustrating the structure of a light emitting diode display apparatus in some embodiments according to the present disclosure.

FIG. 6 is a schematic diagram illustrating the structure of a light emitting diode display apparatus in some embodiments according to the present disclosure. Referring to FIG. 6, the light emitting diode display apparatus in some embodiments includes a base substrate 10, a light extraction layer 2 on the base substrate 10, a first electrode 3 on a side of the light extraction layer 2 distal to the base substrate 10, a light emitting layer 1 on a side of the first electrode 3 distal to the light extraction layer 2, a second electrode 4 on a side of the light emitting layer 1 distal to the first electrode 3, and an encapsulating layer 5 on a side of the second electrode 4 distal to the light emitting layer 1.

In some embodiments, the light emitting, diode display apparatus is a bottom-emission type light emitting diode display apparatus. Optionally, the first electrode 3 in the bottom-emission type organic light emitting diode display apparatus is made of a transparent conductive material. Examples of appropriate transparent conductive materials for making the transparent first electrode 3 include, but are not limited to, zinc oxide, indium gallium oxide, indium zinc oxide, indium titanium oxide, and indium gallium zinc oxide. Optionally, the second electrode 4 in the bottom-emission type organic light emitting diode display apparatus is made of a reflective metal material. Examples of appropriate reflective metal materials for making the reflective second electrode 4 include, but are not limited to, silver.

In some embodiments, the light emitting diode display apparatus is a top-emission type organic light emitting diode display apparatus. Optionally, the first electrode 3 in the top-emission type organic light emitting diode display apparatus is made of a reflective metal material. Examples of appropriate reflective metal materials for making the reflective first electrode 3 include, but are not limited to, silver. Optionally, the second electrode 4 in the top-emission type organic light emitting diode display apparatus is made of a transparent conductive material. Examples of appropriate transparent conductive materials for making the transparent second electrode 4 include, but are not limited to, zinc oxide, indium gallium oxide, indium zinc oxide, indium titanium oxide, and indium gallium zinc oxide.

Figure 7:
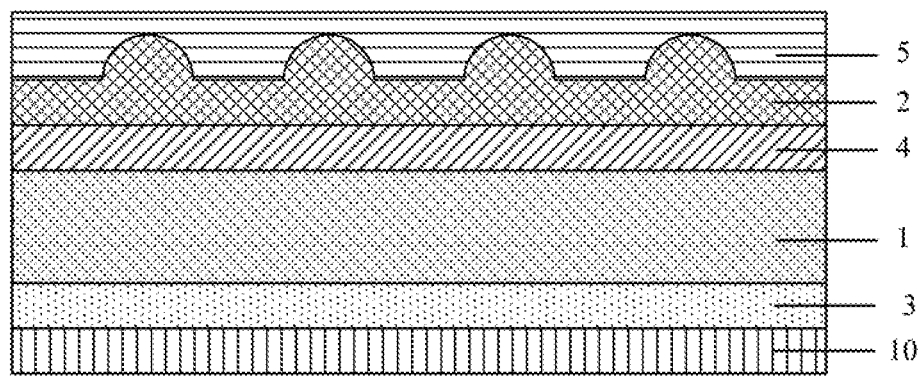
FIG. 7 is a schematic, diagram illustrating the structure of a light emitting diode display apparatus in some embodiments according to the present disclosure.

FIG. 7 is a schematic diagram illustrating the structure of a light emitting diode display apparatus in some embodiments according to the present disclosure. Referring to FIG. 7, the light emitting diode display apparatus in some embodiments includes a base substrate 10, a first electrode 3 on the base substrate 10, a light emitting layer 1 on a side of the first electrode 3 distal to the base substrate 10, a second electrode 4 on a side of the light emitting layer 1 distal to the first electrode 3, a light extraction layer 2 on a side of the second electrode 4 distal to the light emitting layer 1; and an encapsulating layer 5 on a side of the light extraction layer 2 distal to the second electrode 4.

In some embodiments, the light emitting diode display apparatus is a bottom-emission type light emitting diode display apparatus. Optionally, the first electrode 3 in the bottom-emission type organic light emitting diode display apparatus is made of a transparent conductive material. Examples of appropriate transparent conductive materials for making the transparent first electrode 3 include, but are not limited to, zinc oxide, indium gallium oxide, indium zinc oxide, indium titanium oxide, and indium gallium zinc oxide. Optionally, the second electrode 4 in the bottom-emission type organic light emitting diode display apparatus is made of a reflective metal material. Examples of appropriate reflective metal materials for making the reflective second electrode 4 include, but are not limited to.

In some embodiments, the light emitting diode display apparatus is a top-emission type organic light emitting diode display apparatus. Optionally, the first electrode 3 in the top-emission type organic light emitting diode display apparatus is made of a reflective metal material. Examples of appropriate reflective metal materials for making the reflective first electrode 3 include, but are not limited to, silver. Optionally, the second electrode 4 in the top-emission type organic light emitting diode display apparatus is made of a transparent conductive material. Examples of appropriate transparent conductive materials for making the transparent second electrode 4 include, but are not limited to, zinc oxide, indium gallium oxide, indium zinc oxide, indium titanium oxide, and indium gallium zinc oxide.

Figure 8:
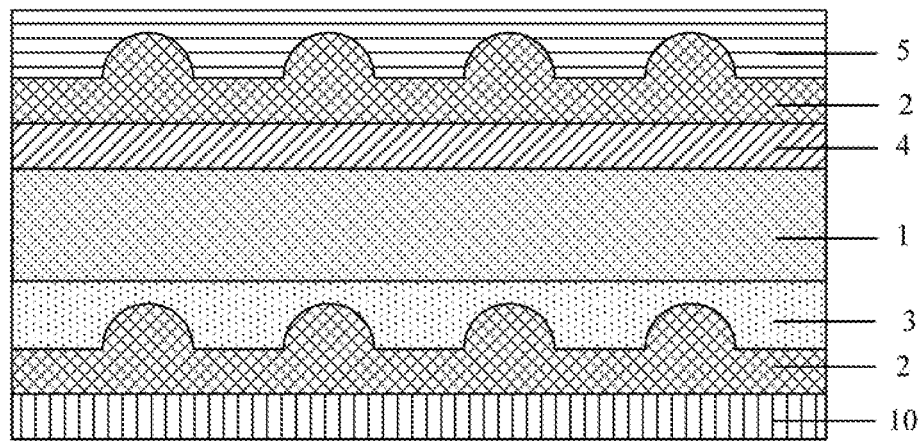
FIG. 8 is a schematic diagram illustrating the structure of a light emitting diode display apparatus in some embodiments according to the present disclosure.

FIG. 8 is a schematic diagram illustrating the structure of a light emitting diode display apparatus in some embodiments according to the present disclosure. Referring to FIG. 8, the light emitting diode display apparatus in some embodiments includes a base substrate 10, a light extraction layer 2 on the base substrate 10, a first electrode 3 on a side of the light extraction layer 2 distal to the base substrate 10, a light emitting layer 1 on a side of the first electrode 3 distal to the light extraction layer 2, a second electrode 4 on a side of the light emitting layer 1 distal to the first electrode 3, a second light extraction layer 2' on a side of the second electrode 4 distal to the light emitting layer 2, and an encapsulating layer 5 on a side of the second light extraction layer 2' distal to the second electrode 4.

In some embodiments, the light emitting diode display apparatus is a dual-emission type light emitting diode display apparatus. Optionally, the first electrode 3 and the second electrode 4 are made of a transflective electrode material. Optionally, a portion of the first electrode 3 is made of a reflective metal material and another portion of first electrode 3 is made of a transparent conductive material. Optionally, a portion of the second, electrode 4 is made of a reflective metal material and another portion of second, electrode 4 is made of a transparent conductive material. Optionally, the base substrate 10 is a transparent base substrate 10.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not, imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a light extraction layer having a corrugated surface, comprising:
   forming a transparent optical material layer using a transparent optical material, the transparent optical material being a curable material;
   deforming the transparent optical material layer by pressing a molding plate comprising a plurality of concave portions on a surface of the molding plate and the transparent optical material layer against each other thereby forming a plurality of first convex portions on the surface of the transparent optical material layer;

subsequent to deforming the transparent optical material layer, modifying a surface of the plurality of first convex portions by curing the transparent optical material layer;

subsequent to modifying the surface of the plurality of first convex portions, re-pressing the molding plate and the transparent optical material layer against each other at least one time; and re-curing the transparent optical material layer after each time re-pressing the molding plate and the transparent optical material layer against each other is repeated, thereby forming a plurality of convex portions on a surface of the transparent optical material; the plurality of convex portions respectively substantially complementary to the plurality of concave portions.

2. The method of claim 1, prior to deforming the transparent optical material layer, further comprising:
heating the transparent optical material layer to reduce solvent content.

3. The method of claim 2, wherein heating the transparent optical material layer is performed at a temperature in a range of approximately 10 degrees to approximately 135 degrees for a duration in a range of approximately 50 seconds to approximately 10 minutes.

4. The method of claim 1, prior to deforming the transparent optical material layer, further comprising:
heating the transparent optical material layer to reduce solvent content;
and
subsequent to deforming the transparent optical material layer, the method further comprising:
modifying a surface of the plurality of first convex portions by curing the transparent optical material layer;
subsequent to modifying the surface of the plurality of first convex portions, re-pressing the molding plate and the transparent optical material layer against each other; and
reiterating modifying and pressing steps at least once.

5. The method of claim 1, further comprising:
baking the transparent optical material layer thereby forming the light extraction layer having the corrugated surface and comprising the plurality of convex portions.

6. The method of claim 5, wherein baking the transparent optical material layer is performed at a temperature in a range of approximately 70 degrees to approximately 190 degrees for a duration in a range of approximately 1 minute to approximately 30 minutes.

7. The method of claim 1, wherein the plurality of concave portions are formed to have a substantially radiused surface.

8. The method of claim 1, wherein pressing the molding plate and the transparent optical material layer against each other is performed under a pressure in a range of approximately 1.5 atmospheric pressure to approximately 2.5 atmospheric pressure for a duration in a range of approximately 15 seconds to approximately 3 minutes.

9. The method of claim 1, wherein curing the transparent optical material layer is performed at a temperature in a range of approximately 30 degrees to approximately 140 degrees for a duration in a range of approximately 1 minute to approximately 10 minutes.

10. The method of claim 1, wherein re-pressing the molding plate and the transparent optical material layer against each other at least one time is performed under a pressure in a range of approximately 1.0 atmospheric pressure to approximately 1.5 atmospheric pressure for a duration in a range of approximately 50 seconds to approximately 20 minutes.

11. The method of claim 1, wherein re-curing the transparent optical material layer is performed at a temperature in a range of approximately 30 degrees to approximately 140 degrees for a duration in a range of approximately 1 minute to approximately 10 minutes.

12. The method of claim 1, wherein forming the transparent optical material layer comprises:
mixing the transparent optical material with an additive to form a mixture; and
forming the transparent optical material layer using the mixture;
wherein the additive promotes formation of a uniform thickness of the transparent optical material layer.

13. A light emitting diode display apparatus having the light extraction layer fabricated by the method of claim 1.

* * * * *